United States Patent
Hwang et al.

(10) Patent No.: US 8,049,485 B2
(45) Date of Patent: Nov. 1, 2011

(54) AC LOSS MEASUREMENT DEVICE OF HIGH-TEMPERATURE SUPERCONDUCTOR

(75) Inventors: Si-Dole Hwang, Daejeon (KR); Song-Ho Sohn, Daejeon (KR); Ji-Hyun Lim, Daejeon (KR); Kyung-Woo Ryu, Gwangju (KR)

(73) Assignee: Korea Electric Power Corporation, Seoul (KR)

( * ) Notice: Subject to any disclaimer, the term of this patent is extended or adjusted under 35 U.S.C. 154(b) by 0 days.

(21) Appl. No.: 12/815,646

(22) Filed: Jun. 15, 2010

(65) Prior Publication Data

US 2011/0102001 A1    May 5, 2011

(30) Foreign Application Priority Data

Oct. 30, 2009    (KR) .................. 10-2009-0104654

(51) Int. Cl.
*G01N 27/00*    (2006.01)
(52) U.S. Cl. .................. 324/71.6; 505/150; 505/151
(58) Field of Classification Search .................. 324/71.6
See application file for complete search history.

(56) References Cited

U.S. PATENT DOCUMENTS

| 5,432,666 | A  | * | 7/1995 | Hodge ............................ 361/19 |
| 7,451,719 | B1 | * | 11/2008 | Fitzpatrick et al. ....... 114/240 R |
| 2004/0066194 | A1 | * | 4/2004 | Slade et al. .................. 324/318 |
| 2009/0247411 | A1 | * | 10/2009 | King et al. .................... 505/220 |

FOREIGN PATENT DOCUMENTS

| JP | 2004-069674 A | 3/2004 |
| JP | 2008232617 A | 10/2008 |
| JP | 2009-152175 A | 7/2009 |
| KR | 0552642 A | 2/2006 |

OTHER PUBLICATIONS

Kyung-Woo, Trans. KIEE vol. 51B. No. 12 Dec. 2002, "Effect of the voltage lead configurations on AC loss Measurement in a single Layer High-Tc Superconducting Model Cable".
Kyung-Woo, The Korea Institute of Applied Superconductivity and Cryogenics vol. 8. No. 3 Sec. 2006, "DC Voltage-Current Characteristics of a High Temperature Superconducting Conductor".

* cited by examiner

*Primary Examiner* — Thomas Valone
(74) *Attorney, Agent, or Firm* — McDermott Will & Emery LLP

(57) ABSTRACT

A measuring device for measuring the alternating current (AC) loss of a high-temperature superconductor is disclosed. In accordance with an embodiment of the present invention, the device includes a pulse power supply unit, which outputs pulse power in a cycle, a lead wire, which is formed on both sides of the pulse power supply unit and applies the pulse power to a superconductor, a degaussing coil unit, which is connected to one side of the superconductor and cancels an inductive voltage, a shunt unit, which is serially connected between one side of the degaussing coil unit and one side of the pulse power supply unit, and a measurement unit, which is connected to both ends of the shunt unit and measures an electric current flowing through the superconductor.

3 Claims, 4 Drawing Sheets

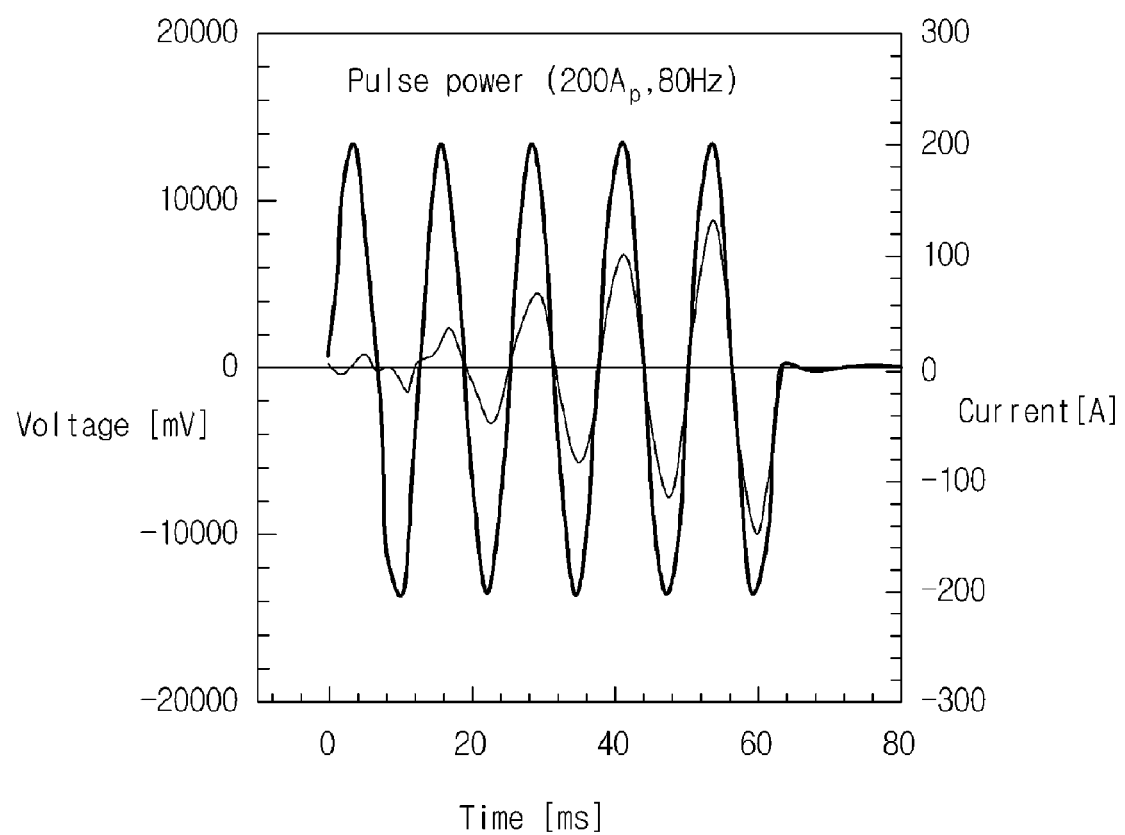

AC LOSS MEASUREMENT DEVICE OF HIGH-TEMPERATURE SUPERCONDUCTOR

CROSS-REFERENCE TO RELATED APPLICATIONS

This application claims the benefit of Korean Patent Application No. 10-2009-0104654, filed with the Korean Intellectual Property Office on Oct. 30, 2009, the disclosure of which is incorporated herein by reference in its entirety.

BACKGROUND

1. Technical Field

The present invention is related to an AC loss measuring device for a high-temperature superconductor.

2. Description of the Related Art

Superconductors generally have no resistance to direct current (DC), and thus no loss. When alternating current (AC) flows in the superconductor, however, loss occurs in the superconductor if the current changes with time or the magnetic field changes with time.

Measurement of the AC loss is a very important factor in determining the cooling capacity and the heat inside connections. Moreover, since the AC loss is mainly caused by the change in current and external magnetic field, an alternating current is first applied and then the loss thereof is calculated in an AC loss measuring device for a superconductor.

In the conventional AC loss measuring device for a high-temperature superconductor, an electric current having a certain frequency and amplitude is applied to a superconductor, and then the waveform of the received voltage or electric current is measured. In this conventional method, however, the superconductor may be damaged if an electric current of about 35 A is applied to the superconductor for tens of seconds.

Also, in the conventional AC loss measuring device for a high-temperature superconductor, the preparation for normal operations takes tens of seconds.

SUMMARY

The present invention provides an AC loss measuring device for a high-temperature superconductor that can improve a test rated current.

The present invention also provides an AC loss measuring device for a high-temperature superconductor that can provide high reliability by minimizing the effect of temperature increase in a superconductive sample while the temperature is extremely high.

Also, the present invention provides an AC loss measuring device for a high-temperature superconductor that can be small and light and shorten the time required for measurement.

An aspect of the present invention provides a measuring device for measuring an alternating current (AC) loss of a high-temperature superconductor. The device in accordance with an embodiment of the present invention can include a pulse power supply unit, which outputs pulse power in a cycle, a lead wire, which is formed on both sides of the pulse power supply unit and applies the pulse power to a superconductor, a degaussing coil unit, which is connected to one side of the superconductor and cancels an inductive voltage, a shunt unit, which is serially connected between one side of the degaussing coil unit and one side of the pulse power supply unit, and a measurement unit, which is connected to both ends of the shunt unit and measures an electric current flowing through the superconductor.

The device can include a pulse oscillator, which provides a sine wave control signal to the pulse power supply unit.

The device can include a cooling unit, which cools the superconductor.

Additional aspects and advantages of the present invention will be set forth in part in the description which follows, and in part will be obvious from the description, or may be learned by practice of the invention.

BRIEF DESCRIPTION OF THE DRAWINGS

FIG. 4 is a graph illustrating voltage and electric current that are measured after pulse power is applied to the superconductive sample of FIG. 3 by an AC loss measuring device for a high-temperature superconductor in accordance with an embodiment of the present invention.

DETAILED DESCRIPTION

Figure 1:
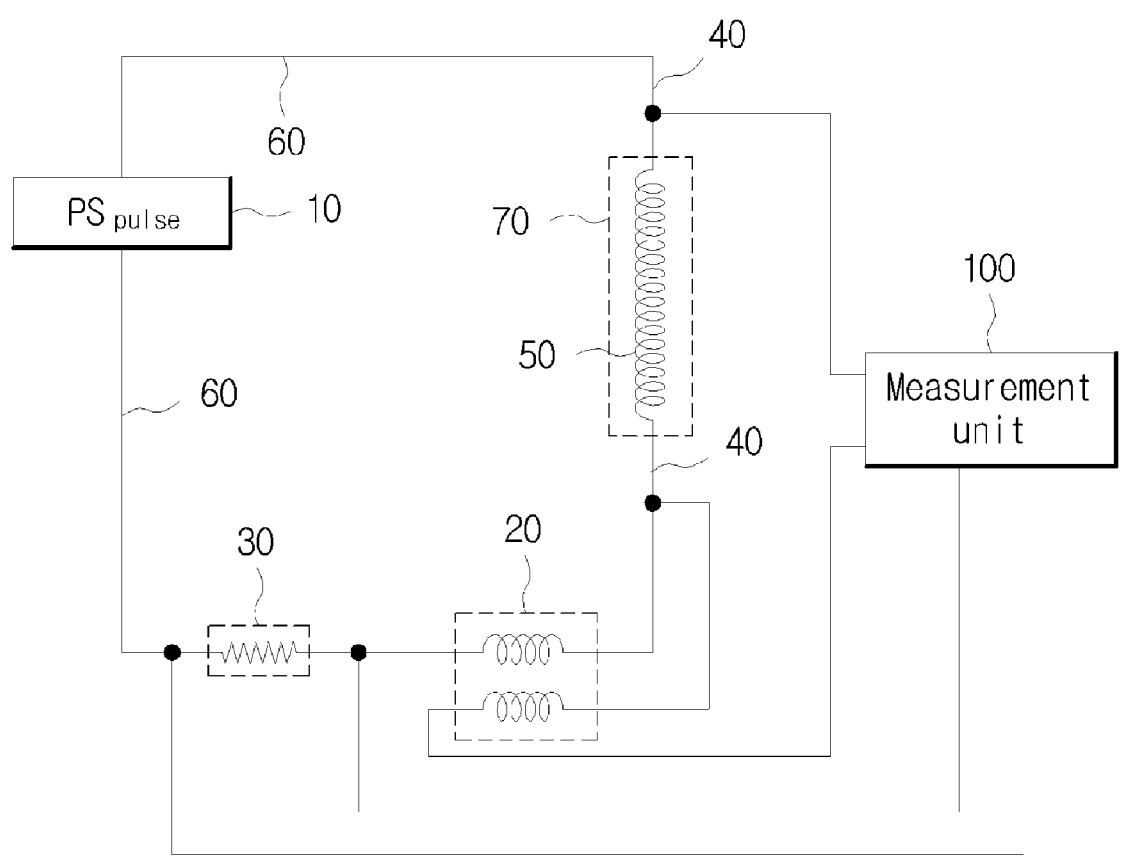
FIG. 1 is a block diagram illustrating an AC loss measuring device for a high-temperature superconductor in accordance with an embodiment of the present invention.

As the invention allows for various changes and numerous embodiments, a particular embodiment will be illustrated in the drawings and described in detail in the written description. However, this is not intended to limit the present invention to a particular mode of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another.

The terms used in the present specification are merely used to describe a particular embodiment, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A certain embodiment in accordance with the present invention will be described in more detail through the below description with reference to the accompanying drawings. Those components that are the same or are in correspondence are rendered the same reference numeral regardless of the figure number, and redundant descriptions are omitted.

FIG. 1 is a block diagram illustrating a device for measuring AC loss of a high-temperature superconductor in accordance with an embodiment of the present invention.

Referring to FIG. 1, an AC loss measuring device for a high-temperature superconductor in accordance with an embodiment of the present invention can include a pulse power supply unit 10, lead wires 40 and 60, a degaussing coil unit 20, a cooling unit 70, a shunt unit 30 and an measurement unit 100. Here, the present embodiment of the present invention can include a pulse oscillator (not shown) that generates and applies a sine wave control signal to the pulse power supply unit 10.

More specifically, the lead wires 40 and 60 can include a power lead wire 60 and an electric current lead wire 40. The power lead wire 60 is connected to the pulse power supply unit 10 and uses an electric wire that does not change its electrical property even if a high electric current is applied. The electric current lead wire 40 is electrically connected to a superconductor 50. Here, the electric current lead wire 40 can be made of a material that is different from that of the power lead wire 60.

The cooling unit 70 maintains the temperature of the superconductor 50 below a critical temperature. Used for the cooling unit 70 can be a container that is capable of containing liquid nitrogen or liquid helium. Here, the cooling unit 70 can include an outer case that has a superb thermal insulation property.

The degaussing coil unit 20 cancels an inductive voltage. That is, the erasing coil unit 20 cancels an inductive voltage component generated by the change in magnetic field because a very small voltage signal has to be extracted from a strong magnetic field due to the low-voltage, high-current property of the superconductor. This arrangement can allow the measurement unit 100 to measure a clear voltage waveform.

The degaussing coil unit 20 is constituted by a coil that is serially connected to the power lead wire 60 and the electric current lead wire 40 and a coil that is connected to the measurement unit 100 and the electric current lead wire 40.

The shunt unit 30 has a resistance component such that the measurement unit 100 can measure an electric current flowing through the superconductor 50.

The measurement unit 100 is connected parallel with the shunt unit 30 and measures the electric current flowing through the superconductor 50. The measurement unit 100 also measures the voltage of both ends of the superconductor 50. To measure the voltage of the superconductor 50, one end of the measurement unit 100 is connected to the superconductor 50, and the other end is connected to the degaussing coil unit 20.

The pulse power supply unit 10 supplies pulse power to the superconductor 50 in a few cycles (a few milliseconds). The pulse power supply unit 10 makes it possible to measure AC loss in a short time by supplying a voltage and an electric current to the superconductor 50 in a very short time. Since the pulse power supply unit 10 supplies pulse power in a short time, the effect of temperature increase on the AC loss of the superconductor 50 can be minimized. Also, since the pulse power supply unit 10 supplies pulse power, the increase in temperature of the superconductor 50 can be reduced, allowing the cooling unit 70 to be small and light.

Furthermore, since the pulse power supply unit 10 supplies pulse power, the time required for measurement can be shortened.

Since the pulse power is applied in a short time, the size of the pulse power supply unit 10 can be reduced so that the measuring device can become small.

Figure 2:
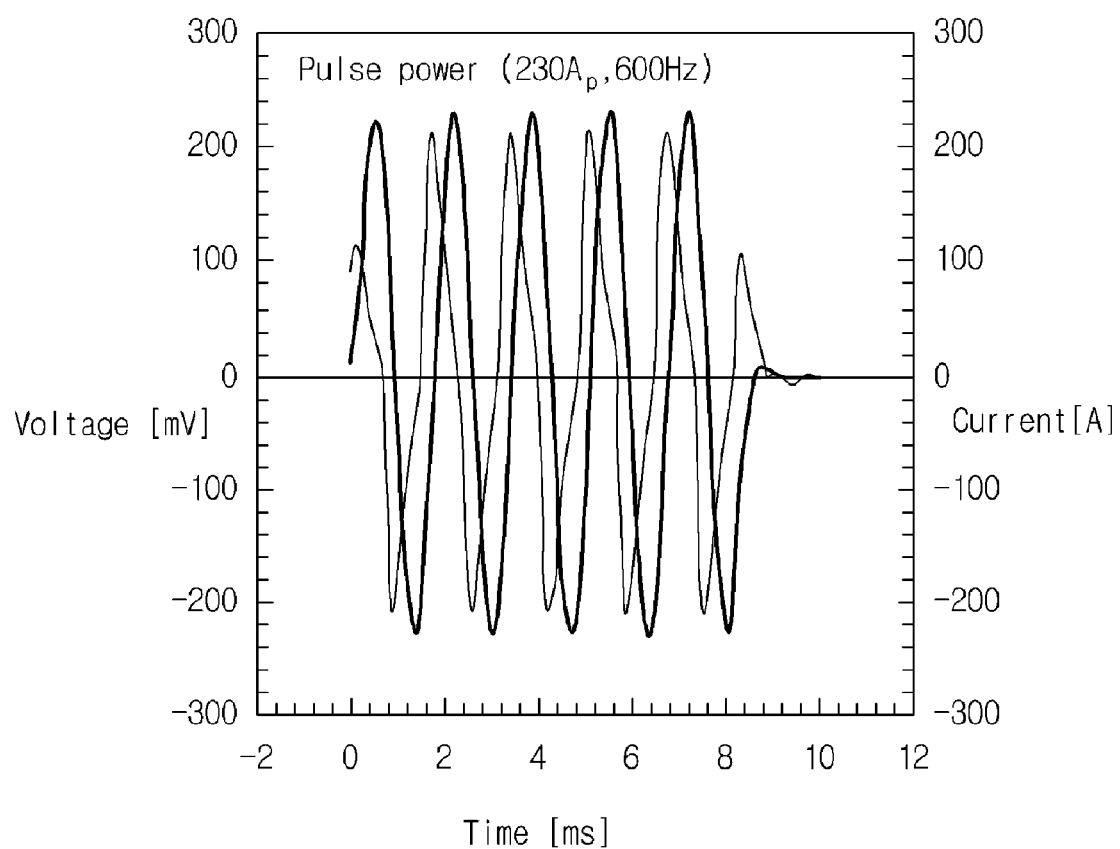
FIG. 2 is a graph illustrating an electric current waveform and a voltage waveform of a superconductive sample that are measured by an AC loss measuring device for a high-temperature superconductor in accordance with an embodiment of the present invention.

FIG. 2 is a graph illustrating an electric current and a voltage of a superconductive sample that is measured by an AC loss measuring device for a high-temperature superconductor in accordance with an embodiment of the present invention.

As illustrated in FIG. 2, an electric current and a voltage that flow in the superconductor are measured after pulse power of 600 Hz is supplied for 8 milliseconds. The test results show that the voltage, which is marked with a solid gray line, is measured to be around 200 mV, and the inductive voltage is cancelled by the degaussing coil unit 20.

The electric current measured is marked with a solid black line, and it can be seen that the characteristic of the superconductor is measured to be good even at a maximum current of 230 A.

Figure 3:
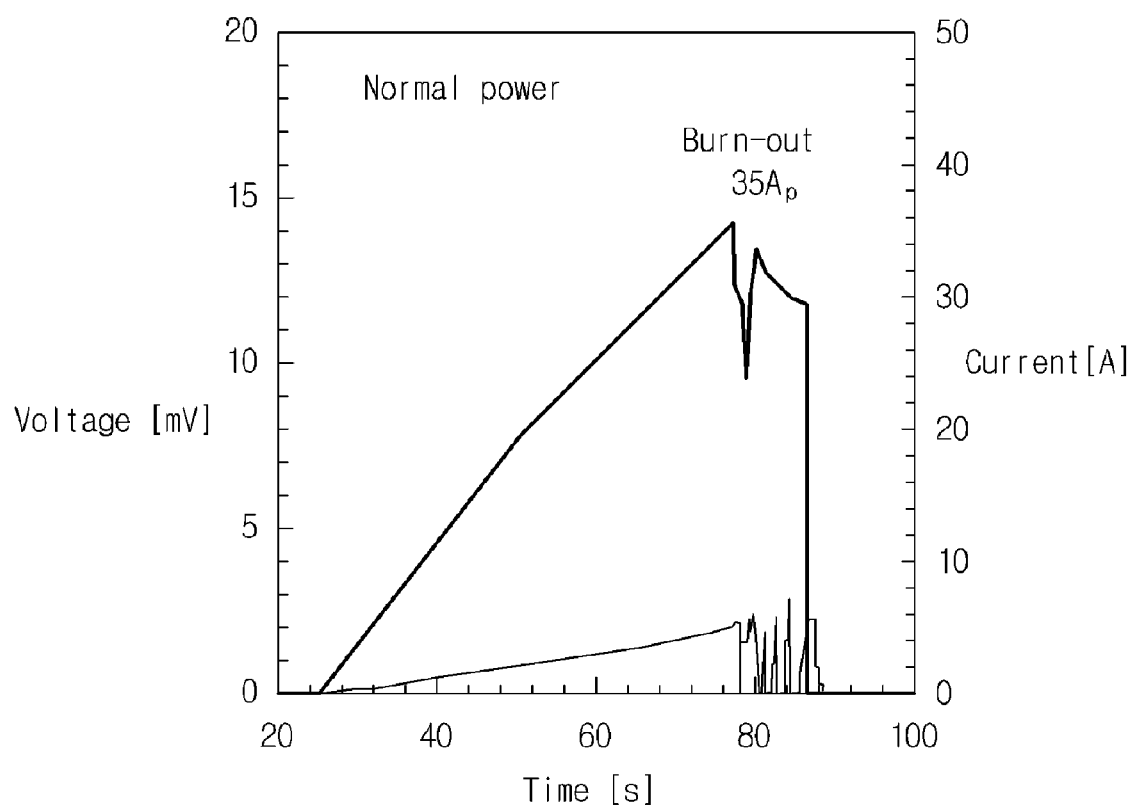
FIG. 3 is a graph illustrating an electric current waveform and a voltage waveform of a superconductive sample that are measured by an AC loss measuring device for a high-temperature superconductor in accordance with the related art.

FIG. 3 is a graph illustrating an electric current waveform and a voltage waveform of a superconductive sample that are measured by an AC loss measuring device for a high-temperature superconductor in accordance with the related art, and FIG. 4 is a graph illustrating a voltage waveform and an electric current waveform that are measured after pulse power is applied to the superconductive sample of FIG. 3 by an AC loss measuring device for a high-temperature superconductor in accordance with an embodiment of the present invention.

FIG. 3 is a graph illustrating voltage and electric current measured after constant power is applied for tens of seconds to measure the AC loss of a superconductor. In the conventional technology, as shown in FIG. 3, a superconductor is burned out by, for example, the heat inside the superconductor because electric power is supplied for a long time. The electric current, at which the superconductor is burned out, is 35 A, and the superconductor is burned out about 90 seconds later.

However, after the superconductive sample of FIG. 3 is measured by an AC loss measuring device for a high-temperature superconductor in accordance with an embodiment of the present invention, it can be seen that a different voltage waveform and a different current waveform are observed.

Particularly, it can be seen that an electric current waveform can be observed at 200 A, which is about five times greater than 35 A of the previously measured electric current.

Therefore, it can be seen that a test rated current can be improved by approximately five times by the AC loss measuring device for a high-temperature superconductor in accordance with an embodiment of the present invention, compared to the conventional measuring device.

In one possible embodiment of the present invention, an AC loss measuring device for a high-temperature superconductor can apply pulse power of a few milliseconds, and thus the heat energy caused by AC loss can be reduced, thus making a cooling unit smaller and lighter.

In one possible embodiment of the present invention, an AC loss measuring device for a high-temperature superconductor can also improve a test rated current, thus improving the reliability of a value measured for the AC loss of the high-temperature superconductor.

In one possible embodiment of the present invention, an AC loss measuring device for a high-temperature superconductor does not require a high-end bonding technology for the bonding between an electric current lead and a high-temperature superconductive sample.

While the spirit of the present invention has been described in detail with reference to a particular embodiment, the embodiment is for illustrative purposes only and shall not limit the present invention. It is to be appreciated that those skilled in the art can change or modify the embodiment without departing from the scope and spirit of the present invention.

As such, many embodiments other than that set forth above can be found in the appended claims.

What is claimed is:

1. A measuring device for measuring an alternating current (AC) loss of a high-temperature superconductor, the device comprising:
    a pulse power supply unit configured to output pulse power in a cycle;
    a lead wire formed on both sides of the pulse power supply unit and configured to apply the pulse power to a superconductor;
    a degaussing coil unit connected to one side of the superconductor and configured to cancel an inductive voltage;
    a shunt unit serially connected between one side of the degaussing coil unit and one side of the pulse power supply unit; and
    a measurement unit connected to both ends of the shunt unit and configured to measure an electric current flowing through the superconductor.

2. The device of claim 1, comprising a pulse oscillator configured to provide a sine wave control signal to the pulse power supply unit.

3. The device of claim 1, comprising a cooling unit configured to cool the superconductor.

* * * * *